US010593809B2

(12) United States Patent
Suzuki et al.

(10) Patent No.: US 10,593,809 B2
(45) Date of Patent: Mar. 17, 2020

(54) SEMICONDUCTOR DEVICE INCLUDING OXIDE SEMICONDUCTOR THIN-FILM TRANSISTOR HAVING MULTILAYER STRUCTURE OXIDE SEMICONDUCTOR LAYER

(71) Applicant: Sharp Kabushiki Kaisha, Sakai, Osaka (JP)

(72) Inventors: Masahiko Suzuki, Sakai (JP); Tohru Daitoh, Sakai (JP); Hajime Imai, Sakai (JP); Tetsuo Kikuchi, Sakai (JP); Setsuji Nishimiya, Sakai (JP); Teruyuki Ueda, Sakai (JP); Kengo Hara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/182,643

(22) Filed: Nov. 7, 2018

(65) Prior Publication Data

US 2019/0148558 A1     May 16, 2019

(30) Foreign Application Priority Data

Nov. 14, 2017   (JP) .................................. 2017-219300

(51) Int. Cl.
*H01L 29/10*       (2006.01)
*H01L 21/00*       (2006.01)
*H01L 29/786*      (2006.01)

(52) U.S. Cl.
CPC ...... *H01L 29/7869* (2013.01); *H01L 29/1054* (2013.01); *H01L 29/78648* (2013.01)

(58) Field of Classification Search
CPC ............. H01L 29/7869; H01L 29/1054; H01L 29/78648; H01L 29/3262; H01L 29/41733; H01L 29/4908
See application file for complete search history.

(56) References Cited

U.S. PATENT DOCUMENTS 9,653,614 B2 *   5/2017  Yamazaki ........... H01L 27/1225
10,453,965 B2 * 10/2019  Yamaguchi ........... H01L 27/124
(Continued)

FOREIGN PATENT DOCUMENTS

JP   2012-134475 A    7/2012
JP   2012-160679 A    8/2012
(Continued)

*Primary Examiner* — Alonzo Chambliss
(74) *Attorney, Agent, or Firm* — Keating & Bennett, LLP

(57) ABSTRACT

A semiconductor device includes a substrate and an oxide semiconductor TFT including an oxide semiconductor layer supported by the substrate and having a multilayer structure including a protective oxide semiconductor layer and a channel oxide semiconductor layer disposed closer to the substrate than the protective oxide semiconductor layer, an upper insulating layer on the oxide semiconductor layer, an upper gate electrode disposed on the upper insulating layer, an interlayer insulating layer covering the oxide semiconductor layer and the upper gate electrode, and first and second electrodes electrically connected to the oxide semiconductor layer, wherein a first opening extends through at least the interlayer insulating layer and the protective oxide semiconductor layer, and exposes a portion of the channel oxide semiconductor layer, and the first electrode is disposed on the interlayer insulating layer and within the first opening, and is in direct contact with, within the first opening, the portion.

20 Claims, 7 Drawing Sheets

(56) References Cited

U.S. PATENT DOCUMENTS

| | | | |
|---|---|---|---|
| 2012/0001167 A1* | 1/2012 | Morosawa | H01L 29/7869 257/43 |
| 2012/0138922 A1 | 6/2012 | Yamazaki et al. | |
| 2013/0187152 A1* | 7/2013 | Yamazaki | H01L 29/78693 257/43 |
| 2013/0221347 A1* | 8/2013 | Isobe | H01L 29/7869 257/43 |
| 2013/0256666 A1* | 10/2013 | Chang | H01L 29/78693 257/57 |
| 2013/0320334 A1 | 12/2013 | Yamazaki et al. | |
| 2014/0286076 A1 | 9/2014 | Aoki et al. | |
| 2015/0263312 A1 | 9/2015 | Kanegae | |
| 2017/0229585 A1* | 8/2017 | Yamazaki | H01L 29/78693 |
| 2017/0236949 A1* | 8/2017 | Yamazaki | H01L 27/1225 257/43 |

FOREIGN PATENT DOCUMENTS

| | | |
|---|---|---|
| JP | 2014-7399 A | 1/2014 |
| JP | 2014-209727 A | 11/2014 |
| JP | 2015-195363 A | 11/2015 |

\* cited by examiner

SEMICONDUCTOR DEVICE INCLUDING OXIDE SEMICONDUCTOR THIN-FILM TRANSISTOR HAVING MULTILAYER STRUCTURE OXIDE SEMICONDUCTOR LAYER

BACKGROUND

1. Field

The present disclosure relates to a semiconductor device.

2. Description of the Related Art

Active matrix substrates used for liquid crystal displays and the like include, for each pixel, a switching element such as a thin film transistor (hereafter, "TFT"). Such switching elements that have been widely used include a TFT having an amorphous silicon film as an active layer (hereafter, "amorphous silicon TFT"), and a TFT having a polycrystalline silicon film as an active layer (hereafter, "polycrystalline silicon TFT").

However, such amorphous silicon and polycrystalline silicon serving as the materials for active layers of TFTs have come to be replaced by oxide semiconductors in some cases. The resultant TFTs are referred to as "oxide semiconductor TFTs". Oxide semiconductors have higher mobility than amorphous silicon. Thus, oxide semiconductor TFTs can function faster than amorphous silicon TFTs. Thus, there are known techniques of using oxide semiconductor TFTs to form driving circuits such as a gate driver and a source driver, as monolithic (integrated) structures on substrates.

Although most of oxide semiconductor TFTs have a bottom gate structure, oxide semiconductor TFTs having a top gate structure have also been proposed (for example, Japanese Unexamined Patent Application Publication No. 2015-195363). Such an oxide semiconductor TFT proposed in Japanese Unexamined Patent Application Publication No. 2015-195363 has an oxide semiconductor layer; a gate electrode disposed above the oxide semiconductor layer (on a side of the oxide semiconductor layer, the side being opposite to the other side facing the substrate) with a gate insulating film disposed between the gate electrode and the oxide semiconductor layer; a source electrode; and a drain electrode. The oxide semiconductor layer, the gate insulating film, and the gate electrode are covered with an interlayer insulating film. The source electrode and the drain electrode are, within openings in the interlayer insulating film, in contact with portions of the oxide semiconductor layer (the portions being referred to as a "source contact region" and a "drain contact region").

SUMMARY

The inventors of the present disclosure studied the oxide semiconductor TFT having a top gate structure disclosed in Japanese Unexamined Patent Application Publication No. 2015-195363. As a result, the inventors have found the following: during the production processes of the TFT, a channel-forming region of the oxide semiconductor layer may be damaged and have a lower resistance; this results in an increase in the off-leakage current, and stable TFT characteristics may not be provided.

This phenomenon is also expected in TFTs having a double-gate structure having both of a top gate and a bottom gate.

It is desirable to provide a semiconductor device including an oxide semiconductor TFT having stable characteristics and high reliability.

According to an aspect of the disclosure, there is provided a semiconductor device including a substrate and an oxide semiconductor TFT supported by the substrate, the oxide semiconductor TFT including an oxide semiconductor layer supported by the substrate and having a multilayer structure including a channel oxide semiconductor layer and a protective oxide semiconductor layer, the channel oxide semiconductor layer being disposed closer to the substrate than the protective oxide semiconductor layer, an upper insulating layer disposed on the oxide semiconductor layer, an upper gate electrode disposed on the upper insulating layer so as to partially overlap the oxide semiconductor layer, an interlayer insulating layer covering the oxide semiconductor layer and the upper gate electrode, and a first electrode and a second electrode electrically connected to the oxide semiconductor layer, wherein a first opening extends through at least the interlayer insulating layer and the protective oxide semiconductor layer, and exposes a portion of the channel oxide semiconductor layer, and the first electrode is disposed on the interlayer insulating layer and within the first opening, and is in direct contact with, within the first opening, the portion of the channel oxide semiconductor layer.

DESCRIPTION OF THE EMBODIMENTS

Hereinafter, embodiments according to the present disclosure will be described with reference to the drawings. Semiconductor devices according to embodiments of the present disclosure are applicable to any devices including an oxide semiconductor TFT, and broadly encompass circuit boards such as active matrix substrates, various display devices, and electronic devices, for example. Incidentally, the present disclosure is not limited to the embodiments described below.

First Embodiment

A semiconductor device according to a first embodiment includes a substrate, and at least one oxide semiconductor TFT supported by the substrate. The oxide semiconductor TFT may be, for example, disposed for each pixel of an active matrix substrate, and used as a pixel TFT. Oxide semiconductor TFTs may be used as pixel TFTs and circuit TFTs constituting, for example, driving circuits.

Hereinafter, a TFT having a double-gate structure having both of a bottom gate and a top gate will be described as an example. Incidentally, as described later, an oxide semiconductor TFT according to this embodiment may also be provided as a TFT having a single-gate structure having a top gate alone.

Figure 1A:
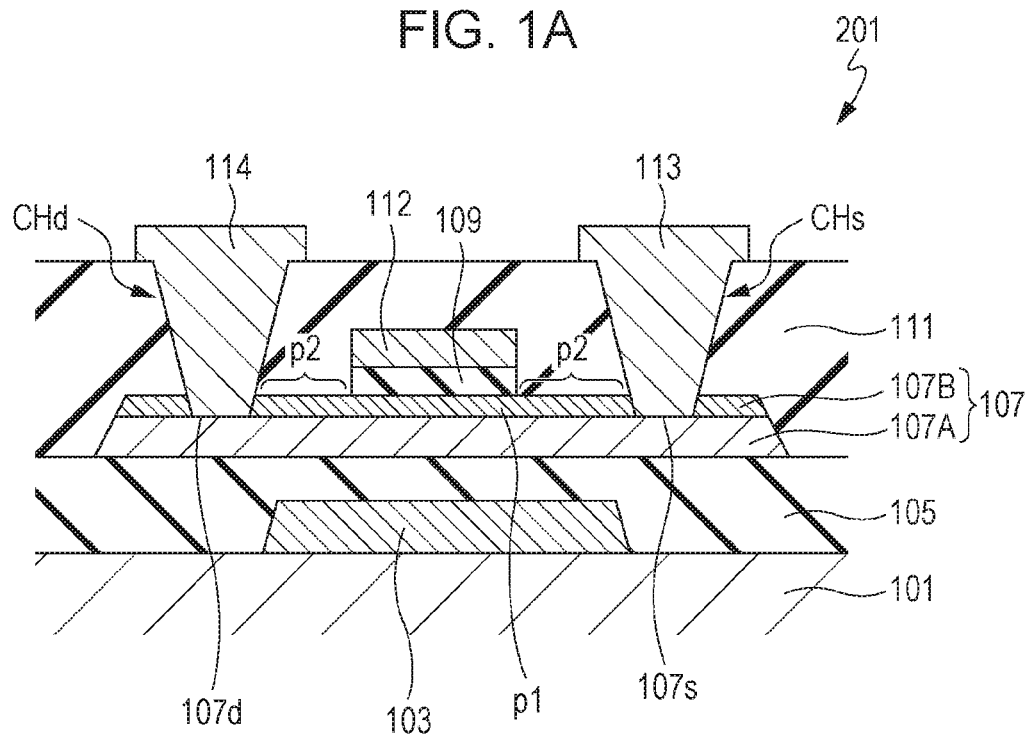
FIG. 1A and FIG. 1B are respectively a schematic sectional view and a plan view of an oxide semiconductor TFT of a semiconductor device according to a first embodiment.
Figure 1B:
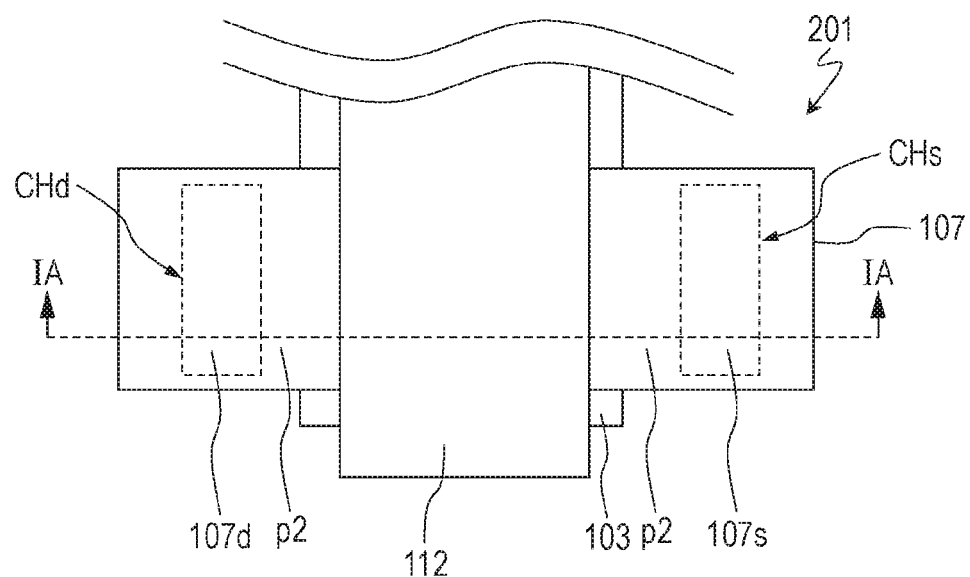

FIG. 1A and FIG. 1B are respectively a sectional view and a plan view of an oxide semiconductor TFT 201 serving as an example of the first embodiment. FIG. 1A is a sectional view taken along line IA-IA in FIG. 1B. Incidentally, for simplicity, in FIG. 1B, the source and drain electrodes are not illustrated.

The oxide semiconductor TFT 201 includes a substrate 101; a lower gate electrode (bottom gate) 103 supported by the substrate 101; a lower insulating layer 105 covering the lower gate electrode 103; an oxide semiconductor layer 107 disposed on the lower insulating layer 105; a source electrode 113; and a drain electrode 114. On the oxide semiconductor layer 107, an upper gate electrode (top gate) 112 is disposed with an upper insulating layer (also referred to as a gate insulating layer) 109 therebetween. The source electrode 113 and the drain electrode 114 are each electrically connected to the oxide semiconductor layer 107. Incidentally, in this Specification, one of the source electrode 113 and the drain electrode 114 may be referred to as a "first electrode", and the other may be referred to as a "second electrode".

The lower gate electrode 103 is disposed so as to face the oxide semiconductor layer 107 with the lower insulating layer 105 therebetween. The upper gate electrode 112 is disposed so as to face the oxide semiconductor layer 107 with the upper insulating layer 109 therebetween. Thus, the lower insulating layer 105 and the upper insulating layer 109 function as gate insulating layers (also respectively referred to as a lower gate insulating layer and an upper gate insulating layer).

In this example, the upper insulating layer 109 is formed only on a region of the oxide semiconductor layer 107, the region corresponding to the upper gate electrode 112. The upper insulating layer 109 may be formed in an island pattern. The upper gate electrode 112 and the upper insulating layer 109 may be formed by, for example, patterning through the same mask. In this case, when viewed from the direction of a line normal to the substrate 101, the periphery of the upper gate electrode 112 may align with the periphery of the upper insulating layer 109.

In this embodiment, the oxide semiconductor layer 107 has a multilayer structure including a channel oxide semiconductor layer 107A and a protective oxide semiconductor layer 107B. The channel oxide semiconductor layer 107A is disposed closer to the substrate 101 than the protective oxide semiconductor layer 107B. In this oxide semiconductor TFT 201, carriers moving between the source and the drain predominantly flow through the channel oxide semiconductor layer 107A.

The channel oxide semiconductor layer 107A and the protective oxide semiconductor layer 107B are, for example, In—Ga—Zn—O-based semiconductor layers differing from each other in composition ratio. The channel oxide semiconductor layer 107A and the protective oxide semiconductor layer 107B may each be a crystalline oxide semiconductor layer including a crystalline portion. The channel oxide semiconductor layer 107A may be, for example, an oxide semiconductor layer having a higher mobility or a smaller bandgap than the protective oxide semiconductor layer 107B. The channel oxide semiconductor layer 107A may be an oxide semiconductor layer having a lower electric resistance than the protective oxide semiconductor layer 107B. The protective oxide semiconductor layer 107B may be an oxide semiconductor layer having higher crystallinity than the channel oxide semiconductor layer 107A. The protective oxide semiconductor layer 107B may be a layer configured to function as an oxygen supply layer that supplies oxygen to the channel oxide semiconductor layer 107A to reduce the oxygen deficiency of the channel oxide semiconductor layer 107A. In this case, the protective oxide semiconductor layer 107B may be formed, for example, under conditions so as to have a higher oxygen content than the channel oxide semiconductor layer 107A.

The oxide semiconductor layer 107, the upper insulating layer 109, and the upper gate electrode 112 are covered with an interlayer insulating layer 111.

The interlayer insulating layer 111 and the protective oxide semiconductor layer 107B of the oxide semiconductor layer 107 have a source opening CHs, which exposes a portion of the channel oxide semiconductor layer 107A, and have a drain opening CHd, which exposes another portion of the channel oxide semiconductor layer 107A. The source electrode 113 is disposed on the interlayer insulating layer 111 and within the source opening CHs, and is, within the source opening CHs, in contact with an exposed portion (hereafter, "source contact region") 107s of the channel oxide semiconductor layer 107A. The drain electrode 114 is disposed on the interlayer insulating layer 111 and within the drain opening CHd, and is, within the drain opening CHd, in contact with an exposed portion (hereafter, "drain contact region") 107d of the channel oxide semiconductor layer 107A. When viewed from the direction of a line normal to the substrate 101, each of the source electrode 113 and the drain electrode 114 may not overlap the upper gate electrode 112.

When viewed from the direction of a line normal to the substrate 101, in the channel oxide semiconductor layer 107A of the oxide semiconductor layer 107, portions not overlapping the upper gate electrode 112 may be lowered-resistance regions having a lower electric resistance than a portion overlapping the upper gate electrode 112. Similarly, when viewed from the direction of a line normal to the substrate 101, in the protective oxide semiconductor layer 107B, portions p2 not overlapping the upper gate electrode 112 may be lowered-resistance regions having a lower electric resistance than a portion p1 overlapping the upper gate electrode 112. Such a configuration is obtained, for example, in the following manner: during formation of the interlayer insulating layer 111, portions of the oxide semiconductor layer 107, the portions not being covered by the upper gate electrode 112 with the upper insulating layer 109 therebetween, are subjected to lowering of the resistance.

In this embodiment, the protective oxide semiconductor layer 107B is formed on the channel oxide semiconductor layer 107A. This configuration enables a reduction in the damage caused by production processes such as a plasma process, on the channel oxide semiconductor layer 107A. This suppresses lowering of the resistance of the channel oxide semiconductor layer 107A caused by process damage (for example, oxygen deficiencies increase in the oxide semiconductor, resulting in an increase in carriers). This enables a decrease in the off-leakage current.

On the other hand, the protective oxide semiconductor layer 107B has higher crystallinity or higher electric resistance than the channel oxide semiconductor layer 107A.

Thus, damage caused on the protective oxide semiconductor layer 107B during production processes does not considerably affect TFT characteristics.

In this embodiment, the source electrode 113 and the drain electrode 114 are in direct contact with the channel oxide semiconductor layer 107A. This enables a reduction in the contact resistance, compared with another case where these electrodes are in contact with the surface of the uppermost layer of the oxide semiconductor layer 107 (in this example, the upper surface of the protective oxide semiconductor layer 107B). This enables suppression of an increase in the on-resistance (contact resistance), and enables a low off-leakage current.

The lower gate electrode 103 may be at the same potential as in the upper gate electrode 112 (may be electrically connected to the upper gate electrode 112), or may be electrically connected to the source electrode 113, for example. The lower gate electrode 103 may be fixed at the power source potential, for example.

The oxide semiconductor TFT 201 in FIGS. 1A and 1B has a double-gate structure having two gate electrodes with the oxide semiconductor layer 107 therebetween. Alternatively, the oxide semiconductor TFT 201 may have a single-gate structure having the upper gate electrode 112 alone. In this case, in a region (on a side closer to the substrate 101) of the lower insulating layer 105, instead of the lower gate electrode 103, a light-shielding film may be disposed that shields light to the channel region of the oxide semiconductor layer 107. Alternatively, a region (on a side closer to the substrate 101) of the oxide semiconductor layer 107 may have no electroconductive film.

In this embodiment, the oxide semiconductor layer 107 has a bilayer structure; alternatively, as described later, the oxide semiconductor layer 107 may have a multilayer structure constituted by three or more layers. Also in this case, the source electrode 113 and the drain electrode 114 are each disposed so as to be in direct contact with, in the oxide semiconductor layer 107, the channel oxide semiconductor layer 107A, which serves as a carrier mobile layer through which carriers predominantly move.

Compositions and Thicknesses of Layers of Semiconductor Layer 107

The channel oxide semiconductor layer 107A and the protective oxide semiconductor layer 107B may contain at least In and Zn. In the channel oxide semiconductor layer 107A, the ratio of the number of In atoms may be higher than the ratio of the number of Zn atoms relative to all metal elements. In the protective oxide semiconductor layer 107B, the ratio of the number of Zn atoms may be higher than the ratio of the number of In atoms relative to all metal elements. When the channel oxide semiconductor layer 107A and the protective oxide semiconductor layer 107B are In—Ga—Zn—O-based oxide semiconductor layers, the ratio of the number of In atoms of the channel oxide semiconductor layer 107A may be higher than the ratio of the number of In atoms of the protective oxide semiconductor layer 107B. In this case, relative to all metal elements of the channel oxide semiconductor layer 107A or the protective oxide semiconductor layer 107B, the ratio of the number of In atoms may be the same as the ratio of the number of Zn atoms.

When the channel oxide semiconductor layer 107A and the protective oxide semiconductor layer 107B have such compositions, the channel oxide semiconductor layer 107A serves as a high-mobility layer having a higher mobility than the protective oxide semiconductor layer 107B, and functions as a channel layer. On the other hand, the protective oxide semiconductor layer 107B serves as a high-crystallinity layer having higher crystallinity than the channel oxide semiconductor layer 107A, and has high etching resistance and high barrier performance. Thus, in steps such as the patterning step for the upper insulating layer 109 and the upper gate electrode 112, and the step of subjecting the oxide semiconductor layer 107 to plasma treatment, the protective oxide semiconductor layer 107B can function as a protective layer and sacrifice layer for the channel oxide semiconductor layer 107A.

The channel oxide semiconductor layer 107A is the lowermost layer of the oxide semiconductor layer 107, and may be in contact with the upper surface of the lower insulating layer 105. The protective oxide semiconductor layer 107B is the uppermost layer of the oxide semiconductor layer 107, and may constitute the upper surface of the oxide semiconductor layer 107. The upper surface of the protective oxide semiconductor layer 107B may be in contact with the upper insulating layer 109 and the interlayer insulating layer 111.

Hereinafter, examples of the compositions of the layers will be described. In the following description, the ratio (composition ratio) of the number of atoms of In relative to all metal elements of the oxide semiconductor will be abbreviated as an "In ratio"; and the ratio of the number of atoms of Zn relative to all metal elements of the oxide semiconductor will be abbreviated as a "Zn ratio". For example, the In ratio of the In—Ga—Zn—O-based semiconductor layer is the ratio of the number of In atoms to the total number of In, Ga, and Zn atoms. When the number of In atoms is represented by [In], the number of Ga atoms is represented by [Ga], and the number of Zn atoms is represented by [Zn], the In ratio is represented by $[In]/([In]+[Ga]+[Zn])$.

The channel oxide semiconductor layer 107A, which is a high-mobility layer, may have an In ratio higher than the Zn ratio ($[In]>[Zn]$), for example. The channel oxide semiconductor layer 107A may have an In ratio of more than 0.3. When the channel oxide semiconductor layer 107A is an In—Ga—Zn—O-based semiconductor layer, the Ga ratio, which is the ratio of the number of Ga atoms to the total number of In, Ga, and Zn atoms, may be lower than the Zn ratio and the In ratio, for example. The Ga ratio may be less than 0.3.

When the channel oxide semiconductor layer 107A is an In—Ga—Zn—O-based semiconductor layer, the channel oxide semiconductor layer 107A may satisfy the following composition ranges, for example.

$$[In]/([In]+[Ga]+[Zn])>0.3$$

$$[In]>[Ga],[In]>[Zn],[Zn]>[Ga]$$

$$[Ga]/([In]+[Ga]+[Zn])<0.3$$

The channel oxide semiconductor layer 107A may have a ratio of the number of atoms among In, Ga, and Zn, In:Ga:Zn, of about 5:1:4 (for example, 4 to 6:0.8 to 1.2:3.2 to 4.8). For example, when a sputtering target having a ratio of the number of atoms In:Ga:Zn of 5:1:4 is used to form an oxide semiconductor film, even with an error during the process or doping with impurities, the resultant channel oxide semiconductor layer 107A can have a composition satisfying the above-described range.

The protective oxide semiconductor layer 107B, which is a high-crystallinity layer, may have a Zn ratio higher than the In ratio ($[Zn]>[In]$), for example. The Zn ratio may be more than 0.5. When the protective oxide semiconductor layer 107B is an In—Ga—Zn—O-based semiconductor layer, the Zn ratio may be higher than the total of the Ga ratio and the In ratio. The Ga ratio may be higher than the In ratio.

When the protective oxide semiconductor layer 107B is an In—Ga—Zn—O-based semiconductor layer, the protective oxide semiconductor layer 107B may satisfy the following composition ranges, for example.

$$[Zn]/([In]+[Ga]+[Zn])>0.5$$

$$[Zn]>[In]+[Ga]$$

$$[In]<[Ga]$$

The protective oxide semiconductor layer 107B may have a ratio of the number of atoms among In, Ga, and Zn, In:Ga:Zn, of about 1:3:6 (for example, 0.8 to 1.2:2.4 to 3.6:4.8 to 7.2). For example, when a sputtering target having a ratio of the number of atoms In:Ga:Zn of 1:3:6 is used to form an oxide semiconductor film, even with an error during the process or doping with impurities, the resultant protective oxide semiconductor layer 107B can have a composition satisfying the above-described range.

The following are specific examples of compositions of the channel oxide semiconductor layer 107A and the protective oxide semiconductor layer 107B when the layers are formed of In—Ga—Zn—O-based oxide semiconductors.

The channel oxide semiconductor layer 107A may be formed of an In—Ga—Zn-based oxide having a composition (ratio of number of atoms) of In:Ga:Zn=3:1:2 (=3/6:1/6:2/6), In:Ga:Zn=4:2:3 (=4/9:2/9:3/9), In:Ga:Zn=5:1:3 (=5/9:1/9:3/9), In:Ga:Zn=5:3:4 (=5/12:3/12:4/12), In:Ga:Zn=6:2:4 (=6/12:2/12:4/12), In:Ga:Zn=7:1:3 (=7/11:1/11:3/11), or In:Ga:Zn=5:1:4 (=5/10:1/10:4/10), or an oxide semiconductor having a composition similar to the foregoing.

The protective oxide semiconductor layer 107B may be formed of an In—Ga—Zn—O-based oxide having a composition (ratio of number of atoms) of In:Ga:Zn=1:3:2 (=1/6:3/6:2/6), In:Ga:Zn=2:4:3 (=2/9:4/9:3/9), In:Ga:Zn=1:5:3 (=1/9:5/9:3/9), or In:Ga:Zn=1:3:6 (=1/10:3/10:6/10), or an oxide semiconductor having a composition similar to the foregoing.

The compositions of the layers of the oxide semiconductor layer 107 are not limited to the above-described compositions. For example, the In—Ga—Zn—O-based semiconductor layer may be replaced by, for example, an In—Sn—Zn—O-based semiconductor layer or an In—Al—Sn—Zn—O-based semiconductor layer. The oxide semiconductor layer 107, which at least includes, from the substrate-101 side thereof, the channel oxide semiconductor layer 107A and the protective oxide semiconductor layer 107B in this order, may have a multilayer structure including three or more layers.

When the channel oxide semiconductor layer 107A and the protective oxide semiconductor layer 107B are both In—Ga—Zn—O-based oxide semiconductor layers, the In ratio of the channel oxide semiconductor layer 107A may be higher than the In ratio of the protective oxide semiconductor layer 107B, and one of the channel oxide semiconductor layer 107A and the protective oxide semiconductor layer 107B may have a composition of In:Ga:Zn=1:1:1 (=1/3:1/3:1/3), or a composition similar to this composition.

The layers are not particularly limited in terms of thickness. The channel oxide semiconductor layer 107A may have a thickness of 20 nm or more and 50 nm or less, for example. When the channel oxide semiconductor layer 107A has a thickness of 20 nm or more, electrons predominantly move through the channel oxide semiconductor layer 107A, compared with the protective oxide semiconductor layer 107B, to thereby provide a high-mobility TFT. On the other hand, when the channel oxide semiconductor layer 107A has a thickness of 50 nm or less, turning on/off of the TFT by means of the gate voltage can be performed at a higher speed. The protective oxide semiconductor layer 107B may have a thickness of 3 nm or more and 30 nm or less, for example (the thickness being the thickness of a portion of the protective oxide semiconductor layer 107B, the portion being positioned between the channel oxide semiconductor layer 107A and the upper insulating layer 109). When the protective oxide semiconductor layer 107B has a thickness of 3 nm or more, this results in a more effective reduction in process damage caused on the channel oxide semiconductor layer 107A. On the other hand, when the protective oxide semiconductor layer 107B has a thickness of 30 nm or less, the protective oxide semiconductor layer 107B generates a lower resistance component, which enables suppression of a decrease in the mobility of the TFT.

The channel oxide semiconductor layer 107A may have a larger thickness than the protective oxide semiconductor layer 107B. This ensures, with more certainty, contact between the channel oxide semiconductor layer 107A and the source electrode 113 or the drain electrode 114. When the channel oxide semiconductor layer 107A is designed to be in contact with the source electrode 113 and the drain electrode 114 via the side walls of openings CHs and CHd (refer to FIGS. 4A, 4B, and 5 described later), larger contact areas are provided, which enables a further reduction in the contact resistance.

The thickness of the oxide semiconductor layer 107 as a whole is not particularly limited, and may be 20 nm or more and 60 nm or less, for example.

Method for Producing Oxide Semiconductor TFT 201

Hereinafter, an example of a method for producing the oxide semiconductor TFT 201 will be described. FIGS. 2A to 3B are sectional explanatory views corresponding to steps of the method for producing the oxide semiconductor TFT 201.

Figure 2A:
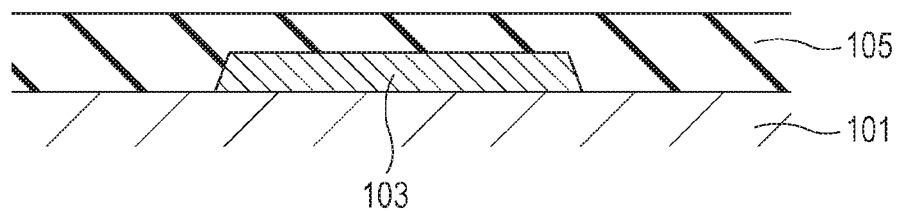
FIG. 2A to FIG. 2D are sectional explanatory views for steps of a method for producing the oxide semiconductor TFT.

Referring to FIG. 2A, on the substrate 101, the lower gate electrode 103 is first formed. Examples of the substrate 101 include a glass substrate, a silicon substrate, and a heat-resistant plastic substrate (resin substrate). In this example, on the substrate 101, a first electroconductive film is deposited, and the first electroconductive film is then patterned to obtain the lower gate electrode 103. The lower gate electrode 103 has a thickness of 50 nm or more and 500 nm or less, for example. The first electroconductive film may be an appropriate film containing a metal such as aluminum (Al), tungsten (W), molybdenum (Mo), tantalum (Ta), chromium (Cr), titanium (Ti), or copper (Cu), an alloy of the foregoing, or a metal nitride of the foregoing.

Subsequently, the lower insulating layer 105 is formed so as to cover the lower gate electrode 103 by CVD, for example. The lower insulating layer 105 may be a silicon oxide ($SiO_2$) layer, a silicon nitride (SiNx) layer, a silicon oxide nitride (SiOxNy; x>y) layer, or a silicon nitride oxide (SiNxOy; x>y) layer, for example. The lower insulating layer 105 may have a multilayer structure. The lower insulating layer 105 may have a thickness of 150 nm or more and 500 nm or less, for example. The lower insulating layer 105 may be formed in the following manner: a substrate-side layer (lower layer) is formed that is, for example, a silicon nitride layer or a silicon nitride oxide layer for preventing diffusion of impurities and the like from the substrate 1; and an overlying layer (upper layer) is formed that is, for example, a silicon oxide layer or a silicon oxide nitride layer for ensuring insulating properties. In this example, a multilayer film is formed that includes a SiO$_2$ film having a thickness of 50 nm and serving as an upper layer, and a SiNx film having a thickness of 300 nm and serving as a lower layer. In this way, the uppermost layer (namely, a layer in contact with the oxide semiconductor layer) of the lower insulating layer 105 may be formed so as to be an oxygen-containing insulating layer (for example, a layer of oxide such as SiO$_2$); in this case, when oxygen deficiency occurs in the oxide semiconductor layer 107, the oxygen deficiency can be dealt with oxygen contained in the oxide layer, which enables a reduction in the oxygen deficiency in the oxide semiconductor layer 107.

Figure 2B:
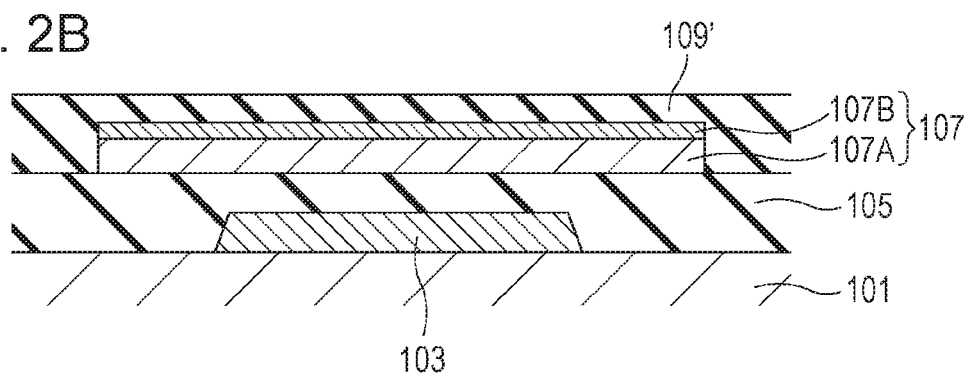

Subsequently, referring to FIG. 2B, on the lower insulating layer 105, the oxide semiconductor layer 107 is formed. The oxide semiconductor layer 107 can be formed in the following manner.

On the lower insulating layer 105, a first oxide semiconductor film and a second oxide semiconductor film are deposited in this order to form an oxide-semiconductor multilayer film.

The first oxide semiconductor film is formed by, for example, sputtering with a target having a ratio of the number of atoms In:Ga:Zn of 5:1:4. The sputtering gas (atmosphere) may be a gas mixture of a rare gas such as argon and an oxidizing gas. Examples of the oxidizing gas include O$_2$, CO$_2$, O$_3$, H$_2$O, and N$_2$O. In this example, a gas mixture of Ar gas and oxygen (O$_2$) gas is used. The proportion of the oxygen gas during formation of the film by sputtering is set such that, for example, the oxygen gas has a partial pressure ratio of more than 0% and 20% or less. The substrate temperature during formation of the film is set at, for example, 100° C. to 180° C. The gas-atmosphere pressure (sputtering pressure) is not particularly limited as long as plasma is discharged with stability, and may be set at, for example, 0.1 to 3.0 Pa. The first oxide semiconductor film may have a thickness of, for example, 3 nm or more and 30 nm or less.

The second oxide semiconductor film is formed by, for example, sputtering with a target having a ratio of the number of atoms In:Ga:Zn of 1:3:6. The sputtering gas may be a gas mixture containing Ar gas and oxygen (O$_2$) gas. The proportion of the oxygen gas during formation of the film by sputtering is set such that, for example, the oxygen gas has a partial pressure ratio of more than 0% and 20% or less. The proportion of the oxygen gas (partial pressure ratio) may be set to be higher than that in the formation of the first oxide semiconductor film. When the second oxide semiconductor film is formed under such conditions that it has a higher oxygen content than the first oxide semiconductor film, the protective oxide semiconductor layer 107B is provided that can function as an oxygen supply layer. The substrate temperature and sputtering pressure during formation of the film may be the same as the substrate temperature and sputtering pressure during formation of the first oxide semiconductor film. The second oxide semiconductor film may have a thickness of, for example, 20 nm or more and 50 nm or less.

Subsequently, the oxide-semiconductor multilayer film is subjected to annealing treatment. Specifically, heat treatment is performed in the air atmosphere at a temperature of 300° C. or more and 500° C. or less. The heat treatment time is, for example, 30 minutes or more and 2 hours or less.

Subsequently, the heat-treated oxide-semiconductor multilayer film is patterned, to obtain the oxide semiconductor layer 107. The oxide-semiconductor multilayer film is patterned by, for example, wet etching with a phosphoric acid-nitric acid-acetic acid etchant. This provides the oxide semiconductor layer 107 formed in an island pattern and having a multilayer structure including, from the lower-insulating-layer-105 side thereof, the channel oxide semiconductor layer 107A and the protective oxide semiconductor layer 107B in this order.

Subsequently, an insulating film 109', which is to serve as an upper insulating layer, is formed so as to cover the oxide semiconductor layer 107. The insulating film 109' is a silicon oxide (SiOx) layer, for example. The insulating film 109' has a thickness of 90 nm or more and 200 nm or less, for example.

Figure 2C:
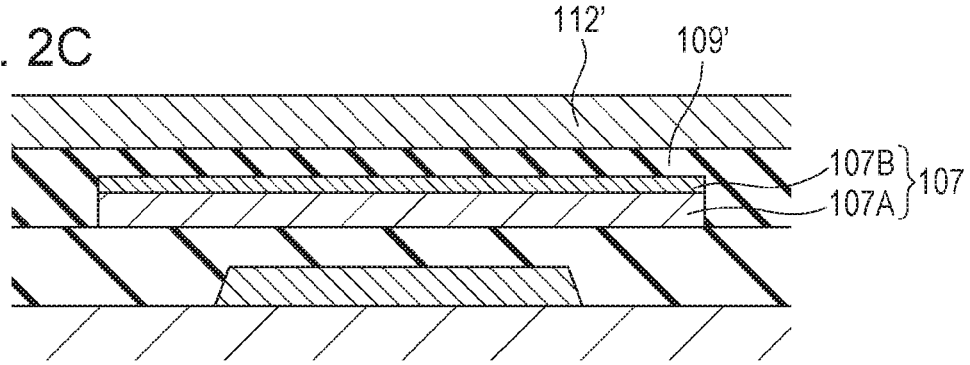

Subsequently, referring to FIG. 2C, on the insulating film 109', a second electroconductive film (thickness: 60 nm or more and 700 nm or less) 112' is deposited, which is to serve as an upper gate electrode. Specifically, the second electroconductive film 112' may be formed of, for example, a metal such as molybdenum (Mo), tungsten (W), aluminum (Al), copper (Cu), titanium (Ti), or tantalum (Ta), or an alloy of the foregoing. The second electroconductive film 112' may have a multilayer structure including a plurality of layers formed of different electroconductive materials.

Figure 2D:
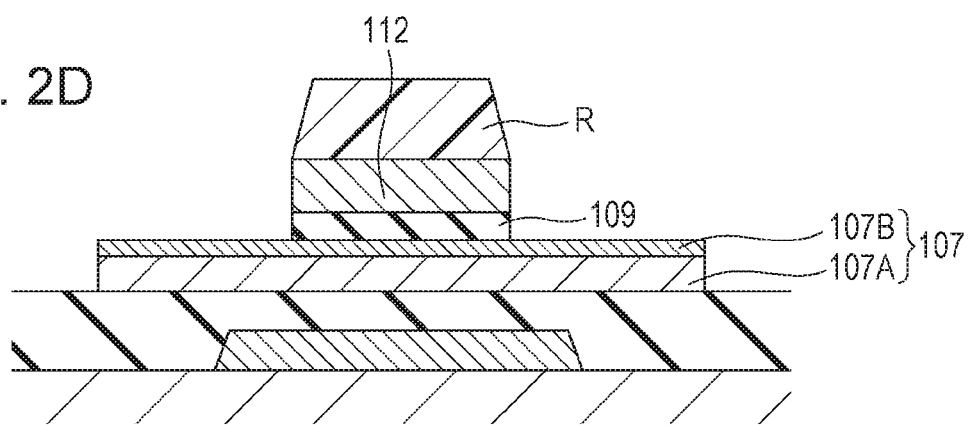

Subsequently, referring to FIG. 2D, the second electroconductive film 112' is patterned to form the upper gate electrode 112. Specifically, a photolithographic step is first performed to form, on a portion of the second electroconductive film 112', a resist layer R serving as an etching mask. Subsequently, wet etching is performed through the resist layer R serving as a mask to pattern the second electroconductive film 112', to obtain the upper gate electrode 112.

Subsequently, dry etching is performed through the resist layer R serving as a mask to pattern the insulating film 109', to obtain the upper insulating layer 109. The oxide semiconductor layer 107 is thus exposed except for a portion (first portion) overlapped by the upper gate electrode 112. The exposed surface layer of the protective oxide semiconductor layer 107B may be overetched. Subsequently, the resist layer R is removed. Incidentally, in order to protect the oxide semiconductor layer 107 from the resist stripper, the resist layer R may be removed and then the upper insulating layer 109 may be patterned through the upper gate electrode 112 serving as a mask.

Subsequently, referring to FIG. 3A, the interlayer insulating layer 111 is formed so as to cover the oxide semiconductor layer 107, the upper insulating layer 109, and the upper gate electrode 112. The interlayer insulating layer 111 is, for example, a silicon oxide (SiOx) layer, a silicon nitride (SiNx) layer, or a silicon oxide nitride (SiNxOy) layer. Alternatively, the interlayer insulating layer 111 may have a multilayer structure that is a stack of such layers. The interlayer insulating layer 111 has a thickness of 150 nm or more and 500 nm or less, for example.

The interlayer insulating layer 111 may include a hydrogen-supply layer such as a silicon nitride layer. When a silicon nitride layer is disposed so as to be in contact with the oxide semiconductor layer 107, portions (in contact with the silicon nitride layer) of the oxide semiconductor layer 107 are reduced and turned into lowered-resistance regions having a lower electric resistance than the first portion in contact with the upper insulating layer 109.

Subsequently, the source opening CHs and the drain opening CHd are formed in the interlayer insulating layer 111 and the protective oxide semiconductor layer 107B so as to expose portions of the channel oxide semiconductor layer 107A. The etching method performed may be dry etching or wet etching. The conditions including the etching time are appropriately set such that the portions of the channel oxide semiconductor layer 107A are exposed.

Subsequently, referring to FIG. 3B, the source electrode 113 and the drain electrode 114 are formed on the interlayer insulating layer 111 and within the source opening CHs and the drain opening CHd, so as to be in direct contact with the channel oxide semiconductor layer 107A.

The source electrode 113 and the drain electrode 114 can be formed by depositing a third electroconductive film for the source and the drain on the interlayer insulating layer 111 by, for example, sputtering, and then patterning the third electroconductive film. The third electroconductive film is formed of, for example, a metal such as molybdenum (Mo), tungsten (W), aluminum (Al), copper (Cu), titanium (Ti), or tantalum (Ta), or an alloy of the foregoing. The source electrode 113 and the drain electrode 114 have a thickness of 100 nm or more and 500 nm or less, for example. The third electroconductive film may be formed as a multilayer film having a stack of three layers of, from the oxide-semiconductor-layer-107 side thereof, a Ti film (thickness: 30 nm), an Al film (thickness: 300 nm), and a Ti film (thickness: 50 nm) in this order, or a stack of two layers of, from the oxide-semiconductor-layer-107 side thereof, a Ti film (thickness: 30 nm) and a Cu film (thickness: 300 nm) in this order. A metal film for source wiring is formed.

The portions of the channel oxide semiconductor layer 107A that are in contact with the source electrode 113 and the drain electrode 114 serve as the source contact region 107s and the drain contact region 107d. In this way, the oxide semiconductor TFT 201 is produced.

Figure 3A:
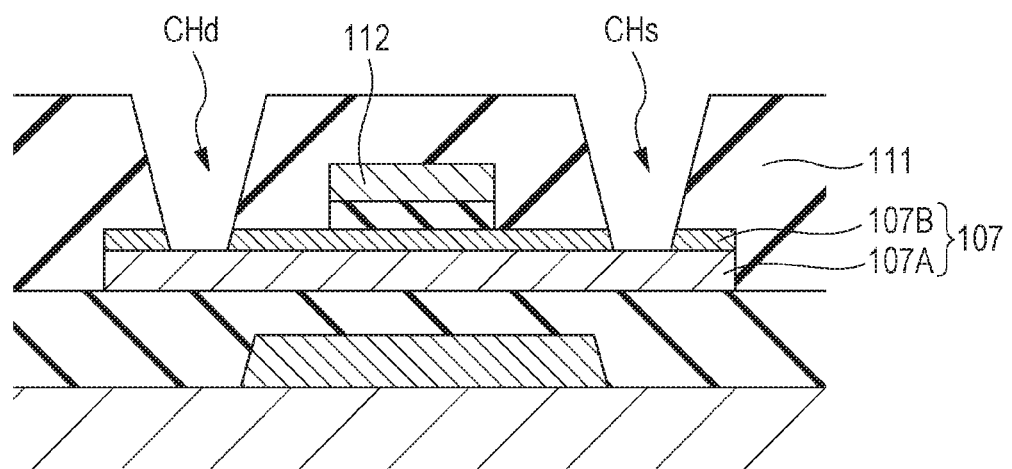
FIG. 3A and FIG. 3B are sectional explanatory views for steps of a method for producing the oxide semiconductor TFT.
Figure 3B:
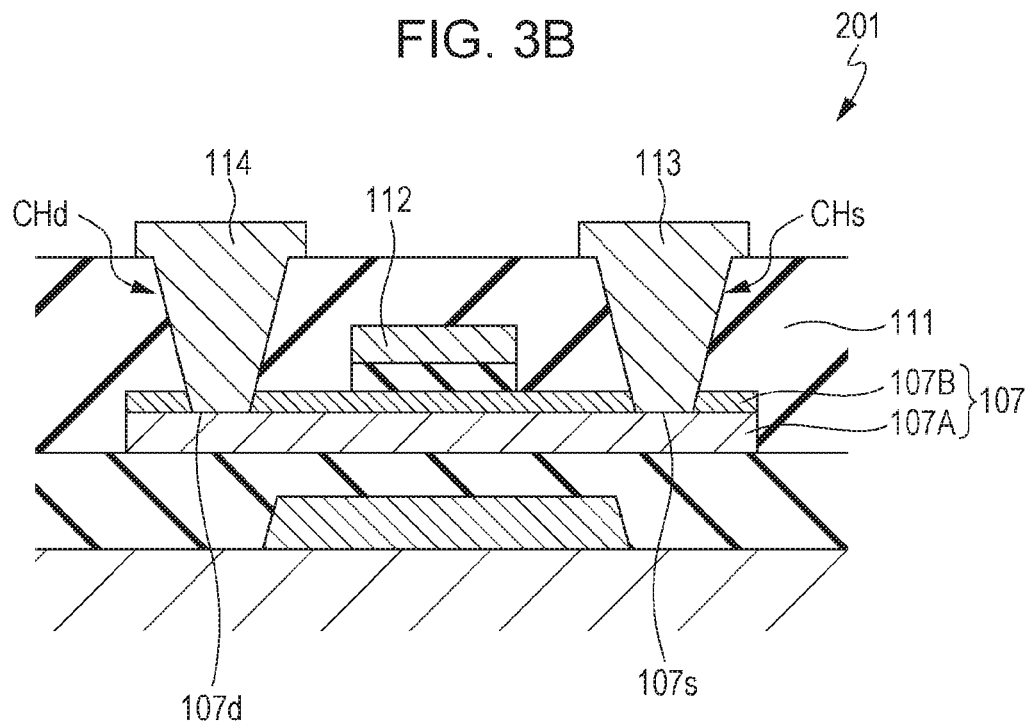
Figure 4A:
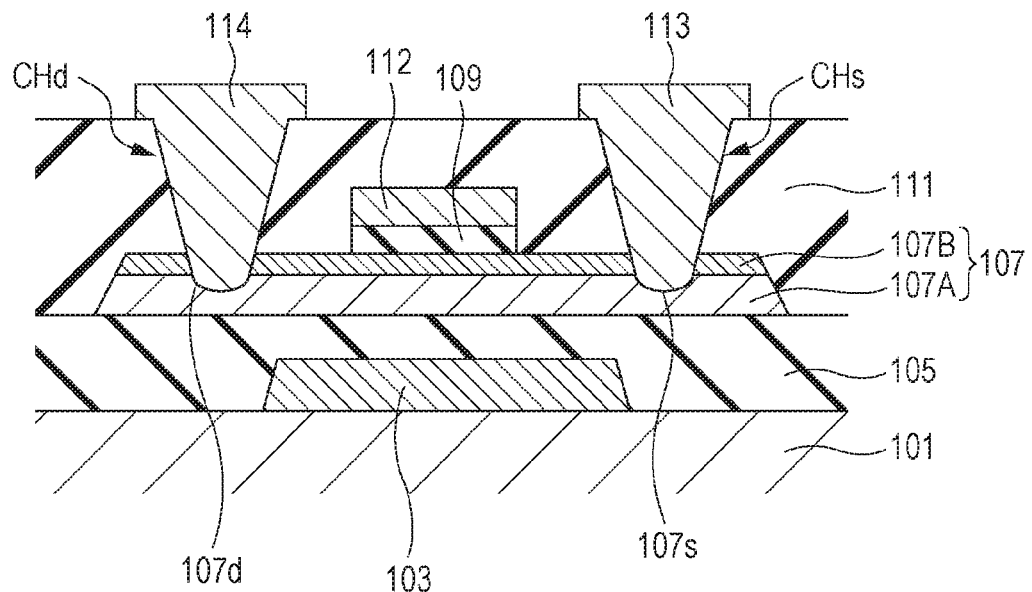
FIG. 4A and FIG. 4B are schematic sectional views of other oxide semiconductor TFTs according to the first embodiment.

Incidentally, in the step illustrated in FIG. 3A, the openings CHs and CHd are formed so as to extend through at least the protective oxide semiconductor layer 107B. For example, as illustrated in FIG. 4A, the surface layer portions of the channel oxide semiconductor layer 107A under the protective oxide semiconductor layer 107B may also be etched. In other words, the bottom surfaces of the openings CHs and CHd may be positioned between the upper surface of the channel oxide semiconductor layer 107A (interface between the channel oxide semiconductor layer 107A and the protective oxide semiconductor layer 107B) and the lower surface of the channel oxide semiconductor layer 107A. In this case, the source electrode 113 and the drain electrode 114 are in contact with the channel oxide semiconductor layer 107A, not only in the bottom surfaces of, but also in the side walls of the openings CHs and CHd. This enables an increase in the contact areas, which enables a more effective reduction in the contact resistance.

Figure 4B:
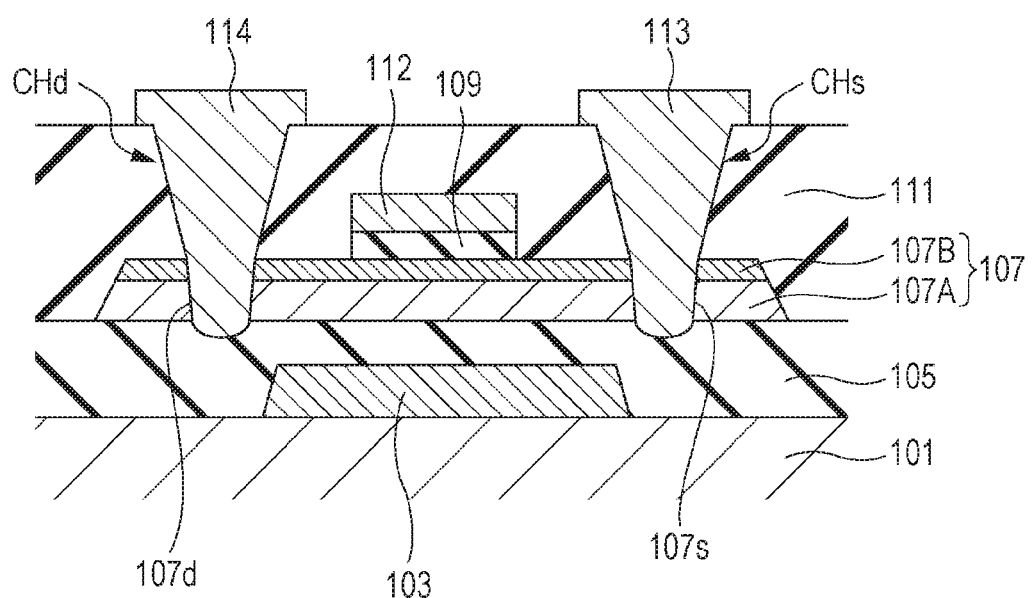

Alternatively, as illustrated in FIG. 4B, the openings CHs and CHd may be formed so as to extend through even the channel oxide semiconductor layer 107A to reach the lower insulating layer 105. In this case, the source electrode 113 and the drain electrode 114 are also in direct contact with, in the side walls of the openings CHs and CHd, the side surfaces of the channel oxide semiconductor layer 107A, which enables a reduction in the contact resistance.

Modifications

Figure 5:
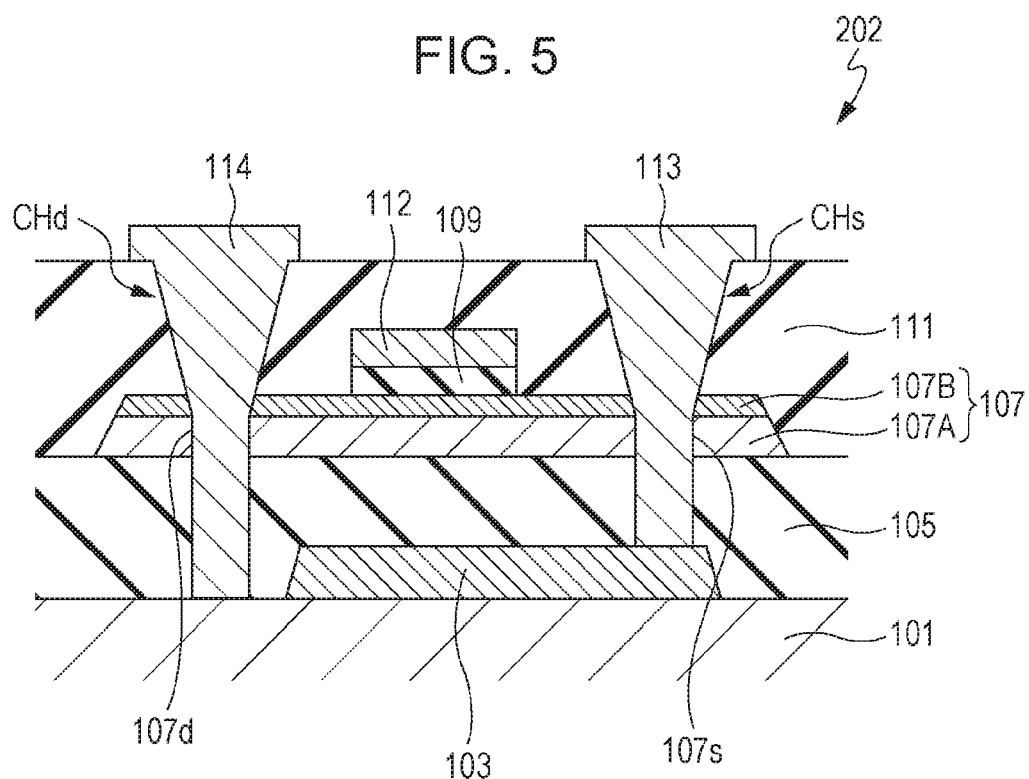
FIG. 5 is a schematic sectional view of an oxide semiconductor TFT serving as a modification of the first embodiment.
Figure 6:
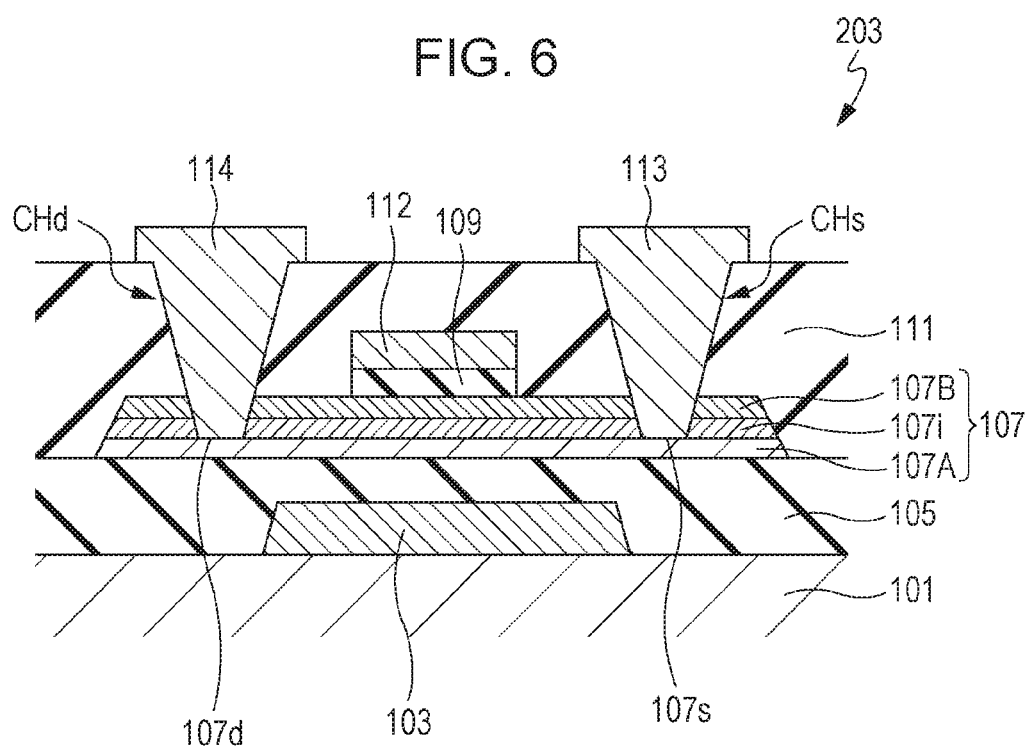
FIG. 6 is a schematic sectional view of an oxide semiconductor TFT serving as another modification of the first embodiment.

FIG. 5 and FIG. 6 are sectional views illustrating modifications of an oxide semiconductor TFT according to this embodiment. In these drawings, like elements in the oxide semiconductor TFT 201 in FIGS. 1A and 1B are denoted by like reference numerals. Hereafter, differences from the oxide semiconductor TFT 201 will be substantially described.

In an oxide semiconductor TFT 202 in FIG. 5, the source opening CHs extends through the interlayer insulating layer 111, the oxide semiconductor layer 107, and the lower insulating layer 105, and exposes a portion of the lower gate electrode 103. On the other hand, when viewed from the direction of a line normal to the substrate 101, the drain opening CHd is disposed so as not to overlap the lower gate electrode 103. The drain opening CHd extends through the interlayer insulating layer 111, the oxide semiconductor layer 107, and the lower insulating layer 105, and exposes a portion of a layer underlying the lower insulating layer 105 (when an undercoating film is formed between the substrate 101 and the lower insulating layer 105, the portion is a portion of the undercoating film).

The source electrode 113 is in direct contact with, in the side wall of the source opening CHs, the channel oxide semiconductor layer 107A, and also in direct contact with, in the bottom surface of the source opening CHs, the lower gate electrode 103. Thus, the source electrode 113 and the lower gate electrode 103 are set at the same potential (for example, the power source potential). On the other hand, the drain electrode 114 is in direct contact with, in the side wall of the drain opening CHd, the channel oxide semiconductor layer 107A, but not in contact with the lower gate electrode 103, and is electrically isolated from the source electrode 113.

The oxide semiconductor TFT 202 can be produced by the same method as in the oxide semiconductor TFT 201 illustrated in FIGS. 1A and 1B. However, when viewed from the direction of a line normal to the substrate 101, the lower gate electrode 103, the source opening CHs, and the drain opening CHd are disposed such that the lower gate electrode 103 overlaps the source opening CHs, but the lower gate electrode 103 does not overlap the drain opening CHd. The etching conditions for forming the source opening CHs and the drain opening CHd are adjusted such that the source opening CHs and the drain opening CHd extend through the lower insulating layer 105.

In the oxide semiconductor TFT 202 in which the source electrode 113 and the lower gate electrode 103 are set at the same potential, the contact portion between the source electrode 113 and the lower gate electrode 103 and the contact portion between the source electrode 113 and the oxide semiconductor layer 107 can be simultaneously formed within the same opening. This enables a reduction in the area for the oxide semiconductor TFT 202. In addition, another contact portion between the source electrode 113 and the lower gate electrode 103 is not necessary, which enables a reduction in the number of production steps.

In an oxide semiconductor TFT 203 in FIG. 6, the oxide semiconductor layer 107 has a trilayer structure constituted by the channel oxide semiconductor layer 107A, the protective oxide semiconductor layer 107B, and an intermediate oxide semiconductor layer 107i disposed between these layers. The channel oxide semiconductor layer 107A is disposed closer to the substrate 101 than the protective oxide semiconductor layer 107B. The protective oxide semiconductor layer 107B may be the uppermost layer of the oxide semiconductor layer 107.

The channel oxide semiconductor layer 107A and the protective oxide semiconductor layer 107B may be the same as the channel oxide semiconductor layer 107A and the protective oxide semiconductor layer 107B that are described above with reference to FIGS. 1A and 1B. For example, the channel oxide semiconductor layer 107A may be a high-mobility layer having higher mobility than the protective oxide semiconductor layer 107B; and the protective oxide semiconductor layer 107B may be a high-crystallinity layer having higher crystallinity than the channel oxide semiconductor layer 107A. The channel oxide semiconductor layer 107A and the protective oxide semiconductor layer 107B may be crystalline oxide semiconductor layers including crystalline portions; and the intermediate oxide semiconductor layer 107*i* may be an amorphous oxide semiconductor layer.

In the oxide semiconductor TFT 203, the source opening CHs and the drain opening CHd are also formed so as to reach the channel oxide semiconductor layer 107A. In other words, the source opening CHs and the drain opening CHd are formed so as to extend through the interlayer insulating layer 111, the protective oxide semiconductor layer 107B, and the intermediate oxide semiconductor layer 107*i*. The source electrode 113 and the drain electrode 114 are respectively, within the source opening CHs and the drain opening CHd, in direct contact with the channel oxide semiconductor layer 107A. Incidentally, the bottom surfaces of the source opening CHs and the drain opening CHd may be positioned between the upper surface and the lower surface of the channel oxide semiconductor layer 107A (refer to FIG. 4A). Alternatively, the source opening CHs and the drain opening CHd may be formed so as to extend through the oxide semiconductor layer 107 (refer to FIG. 4B and FIG. 5).

Hereinafter, an example will be specifically described in which the channel oxide semiconductor layer 107A and the protective oxide semiconductor layer 107B are crystalline oxide semiconductor layers including crystalline portions, and the intermediate oxide semiconductor layer 107*i* is an amorphous oxide semiconductor layer. The term "crystalline oxide semiconductor layer" means an oxide semiconductor layer that predominantly contains a crystalline oxide semiconductor and may contain fine amorphous portions. The term "amorphous oxide semiconductor layer" means an oxide semiconductor layer that predominantly contains an amorphous oxide semiconductor, and may contain fine crystalline portions, for example, microcrystals having a grain size of 1 nm or more and 20 nm or less. For example, the amorphous oxide semiconductor layer serving as the intermediate oxide semiconductor layer may contain microcrystals having a smaller crystal size than the channel oxide semiconductor layer 107A and the protective oxide semiconductor layer 107B.

The channel oxide semiconductor layer 107A and the protective oxide semiconductor layer 107B may have the compositions and thicknesses described above with reference to FIGS. 1A and 1B.

The intermediate oxide semiconductor layer 107*i* is not particularly limited, but may contain In and Zn, for example. In the intermediate oxide semiconductor layer 107*i*, the ratio of the number of In atoms and the ratio of the number of Zn atoms may be substantially equal to each other relative to all metal elements. The intermediate oxide semiconductor layer 107*i* may have an energy gap between that of the channel oxide semiconductor layer 107A and that of the protective oxide semiconductor layer 107B, for example.

In this embodiment, the intermediate oxide semiconductor layer 107*i*, the channel oxide semiconductor layer 107A, and the protective oxide semiconductor layer 107B may have different compositions. The phrase "have different compositions" means that the layers are different from each other in terms of metal elements contained or composition ratio.

The amorphous intermediate oxide semiconductor layer 107*i* is disposed between the crystalline channel oxide semiconductor layer 107A and the crystalline protective oxide semiconductor layer 107B, to thereby suppress crystal lattice mismatches at the interface between the channel oxide semiconductor layer 107A and the protective oxide semiconductor layer 107B. In this case, etching of the oxide-semiconductor multilayer film does not cause generation of "constriction" due to crystal lattice mismatches, to thereby provide the oxide semiconductor layer 107 having a tapering shape. This enables suppression of variations in TFT characteristics and suppression of a negative shift of the threshold voltage of the TFT, and provides an oxide semiconductor TFT having high mobility and high reliability.

The intermediate oxide semiconductor layer 107*i* may be disposed between the channel oxide semiconductor layer 107A and the protective oxide semiconductor layer 107B so as to be in contact with both of the channel oxide semiconductor layer 107A and the protective oxide semiconductor layer 107B. This enables more effective improvements in the interface between the channel oxide semiconductor layer 107A and the protective oxide semiconductor layer 107B.

The intermediate oxide semiconductor layer 107*i* is a layer that improves the interface between the channel oxide semiconductor layer 107A and the protective oxide semiconductor layer 107B. An energy gap Gm of the intermediate oxide semiconductor layer 107*i* may be larger than an energy gap G1 of the channel oxide semiconductor layer 107A, and may be smaller than an energy gap G2 of the protective oxide semiconductor layer 107B (G1<Gm<G2).

The intermediate oxide semiconductor layer 107*i* is not particularly limited, but may have a composition in which crystallization does not occur and an amorphous state is maintained. When the intermediate oxide semiconductor layer 107*i* is an In—Ga—Zn—O-based semiconductor layer, it may have a ratio of the number of atoms among In, Ga, and Zn, In:Ga:Zn, of about 1:1:1 (for example, 0.8 to 1.2:0.8 to 1.2:0.8 to 1.2). For example, when a sputtering target having a ratio of the number of atoms In:Ga:Zn of 1:1:1 is used to form the intermediate oxide semiconductor layer 107*i*, even with an error during the process or doping with impurities, the resultant intermediate oxide semiconductor layer 107*i* can have a composition satisfying the above-described range. Incidentally, when the intermediate oxide semiconductor layer 107*i* has an In:Ga:Zn of 1:1:1, the channel oxide semiconductor layer 107A and the protective oxide semiconductor layer 107B are formed so as to have composition ratios different from In:Ga:Zn=1:1:1. For example, the channel oxide semiconductor layer 107A may be an In—Ga—Zn—O-based semiconductor layer having an In ratio higher than the Zn ratio; and the protective oxide semiconductor layer 107B may be an In—Ga—Zn—O-based semiconductor layer having an In ratio lower than the Zn ratio.

The intermediate oxide semiconductor layer 107*i* may be an oxide semiconductor layer other than In—Ga—Zn—O-based semiconductor layers, such as an In—Sn—Zn—O-based semiconductor layer or an In—Al—Sn—Zn—O-based semiconductor layer. The oxide semiconductor layer 107, which includes the channel oxide semiconductor layer 107A, the intermediate oxide semiconductor layer 107*i*, and the protective oxide semiconductor layer 107B in a predetermined order, may have a multilayer structure of four or more layers. Even in this case, the source electrode 113 and the drain electrode 114 are disposed so as to be in direct contact with, within the source opening CHs and the drain opening CHd, the channel oxide semiconductor layer 107A.

The layers are not particularly limited in terms of thickness; however, the channel oxide semiconductor layer 107A and the protective oxide semiconductor layer 107B may have thicknesses in the above-described ranges. The intermediate oxide semiconductor layer 107*i* may have a thickness of 5 nm or more and 50 nm or less, for example. The intermediate oxide semiconductor layer 107*i* may be formed so as to have a thickness of 15 nm or more, to thereby more effectively improve the interface between the channel oxide semiconductor layer 107A and the protective oxide semiconductor layer 107B. On the other hand, the intermediate oxide semiconductor layer 107i may be formed so as to have a thickness of 50 nm or less, to thereby suppress a decrease in the threshold voltage due to insertion of the intermediate oxide semiconductor layer 107i.

Incidentally, in the oxide semiconductor TFTs 201 to 203 in FIGS. 1A and 1B and FIG. 4A to FIG. 6, the source electrode 113 and the drain electrode 114 are formed from the same electroconductive film; alternatively, the source electrode 113 and the drain electrode 114 may be formed from different electroconductive films. For example, when an oxide semiconductor TFT according to this embodiment is used as a pixel TFT of an active matrix substrate, the source electrode 113 may be formed from an electroconductive film that is also used for forming a source bus line SL, and the drain electrode 114 may be formed from a transparent electroconductive film that is also used for forming a pixel electrode.

The oxide semiconductor TFTs 201 to 203 are described above as examples in which the source electrode 113 and the drain electrode 114 are in direct contact with, within the openings CHs and CHd, the channel oxide semiconductor layer 107A; however, only one of the electrodes may be in direct contact with, within the opening CHs or CHd, the channel oxide semiconductor layer 107A. For example, when the oxide semiconductor layer and the pixel electrode are formed from the same metal oxide film, the source electrode is disposed so as to be in direct contact with, within the source opening CHs, the channel oxide semiconductor layer 107A, and the drain opening CHd may not be formed.

Analysis Results of Semiconductor Layers Having Multilayer Structure

In the above-described method, the compositions and film formation conditions are controlled to form a multilayer film including a crystalline oxide semiconductor film and an amorphous oxide semiconductor film. In order to determine the crystalline state of the oxide semiconductor films immediately after film formation (before annealing treatment) in the method, the inventors of the present disclosure performed the following analysis.

Sample substrates 1 to 3 having a semiconductor monolayer film were prepared. Sample substrate 1 was prepared by forming, on a glass substrate, a first oxide semiconductor film by sputtering. Similarly, Sample substrates 2 and 3 were respectively prepared by forming an intermediate oxide semiconductor film or a second oxide semiconductor film on a glass substrate. The first oxide semiconductor film, the intermediate oxide semiconductor film, and the second oxide semiconductor film formed were In—Ga—Zn—O-based semiconductor films. Each In—Ga—Zn—O-based semiconductor film was formed so as to have a thickness of 100 nm. The following Table 1 summarizes the compositions of targets used for forming the In—Ga—Zn—O-based semiconductor films, and film formation conditions of the In—Ga—Zn—O-based semiconductor films.

TABLE 1

| | Composition of target In:Ga:Zn | Sputtering gas | Film formation temperature |
|---|---|---|---|
| Sample substrate 1 | 5:1:4 | Ar + O₂ O₂ partial pressure: 5% to 20% | 110° C. |
| Sample substrate 2 | 1:1:1 | Ar + O₂ O₂ partial pressure: 0% to 10% | |
| Sample substrate 3 | 1:3:6 | Ar + O₂ O₂ partial pressure: 0% to 20% | |

Subsequently, each Sample substrate was subjected to X-ray diffraction (XRD) analysis. The X-ray diffraction patterns of Sample substrates 1 to 3 are respectively illustrated in FIGS. 7A to 7C.

Figure 7A:
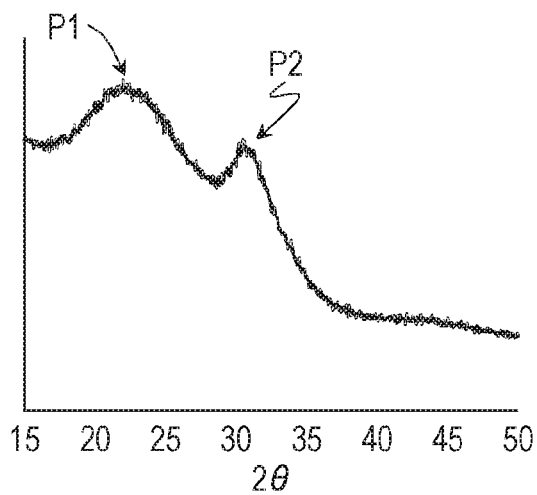
FIG. 7A to FIG. 7C are graphs of XRD analysis results of Sample substrates 1 to 3.
Figure 7B:
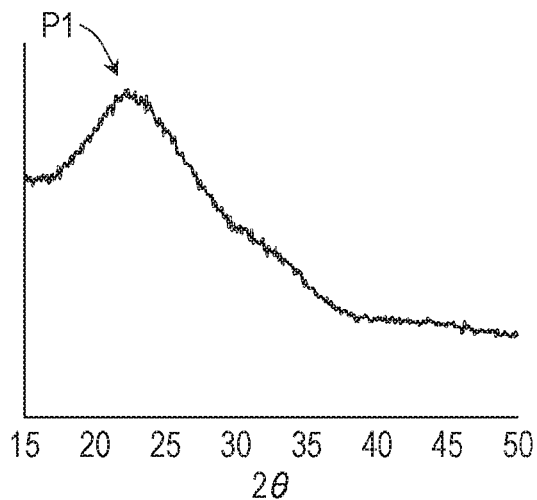
Figure 7C:
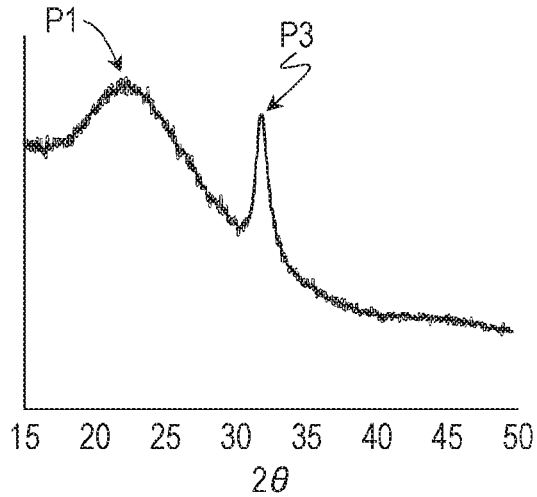

As is understood from FIGS. 7A to 7C, the Sample substrates each have, in the X-ray diffraction pattern, a broad peak P1 in 2θ=20° to 25°. This peak is inferentially derived from the glass substrate. As illustrated in FIG. 7A, the Sample substrate 1 has, in the X-ray diffraction pattern, in addition to the peak P1 of the glass substrate, a crystalline peak P2 in 2θ=about 30°. As illustrated in FIG. 7C, the Sample substrate 3 has, in the X-ray diffraction pattern, in addition to the peak P1 of the glass substrate, a crystalline peak P3 at 2θ=about 32°. These results demonstrate that the semiconductor films of the Sample substrate 1 and the Sample substrate 3 are crystalline. The peak P3 of the Sample substrate 3 is narrower (has a smaller peak width) than the peak P2 of the Sample substrate 1; this demonstrates that the semiconductor film of the Sample substrate 3 has higher crystallinity. On the other hand, the Sample substrate 2 has no crystalline peak; this demonstrates that the semiconductor film of the Sample substrate 2 is amorphous.

Incidentally, even when the Sample substrate 2 is subjected to the above-described annealing treatment, the intermediate oxide semiconductor film remains in the amorphous state. When the Sample substrates 1 and 3 are subjected to the annealing treatment, the first and second oxide semiconductor films may have increased crystallinity.

As has been described, a semiconductor monolayer film was formed on each substrate, and determined in terms of the crystalline state. By contrast, when a plurality of semiconductor films are stacked to form a semiconductor multilayer, it is difficult to determine the crystalline state of each semiconductor film by XRD analysis. The crystalline state of each layer of a semiconductor multilayer can be determined by, for example, TEM observation of a section of the semiconductor multilayer. The compositions of the layers of a semiconductor multilayer can be analyzed by XPS or AES, for example.

Evaluation of TFT Characteristics

An Example TFT was first prepared by the same method as the method for producing the oxide semiconductor TFT 201 (FIGS. 1A and 1B). The Example TFT has an active layer having a bilayer structure including, as a channel oxide semiconductor layer, an In—Ga—Zn—O-based semiconductor layer (thickness: 20 nm) having a ratio of the number of atoms among In, Ga, and Zn, In:Ga:Zn, of about 5:1:4, and, as a protective oxide semiconductor layer, an In—Ga—Zn—O-based semiconductor layer (thickness: 10 nm) having a ratio of the number of atoms among In, Ga, and Zn, In:Ga:Zn, of about 1:3:6.

A Comparative Example TFT was also prepared by the same method as in the Example TFT except that the protective oxide semiconductor layer was not formed. Specifically, the Comparative Example TFT has an active layer having a monolayer structure of an In—Ga—Zn—O-based semiconductor layer (thickness: 20 nm) having a ratio of the number of atoms among In, Ga, and Zn, In:Ga:Zn, of about 5:1:4.

The Comparative Example TFT was found to have a mobility of 24.7 cm$^2$/V·s, while the Example TFT was found to have a mobility of 26.7 cm$^2$/V·s. The reason for this result is inferred as follows: the Example TFT is provided so as to have a lower contact resistance than the Comparative Example TFT (for example, the Example TFT has a contact resistance that is about $\frac{1}{10}$ to about $\frac{1}{100}$ of the contact resistance of the Comparative Example TFT), and, as a result, the Example TFT has an on-state current about 10% higher than that of the Comparative Example TFT.

In the Comparative Example TFT, the channel oxide semiconductor layer 107A is subjected to process damage and, as a result, oxygen deficiency may be caused within the channel oxide semiconductor layer 107A, and the resistance may decrease. This may cause a negative shift of the threshold voltage, and the off-leakage current may increase. By contrast, in the Example TFT, the channel oxide semiconductor layer 107A, which is a high-mobility layer, is protected by the protective oxide semiconductor layer 107B and scarcely subjected to process damage. Carriers predominantly flow through the channel oxide semiconductor layer 107A, which has not been subjected to process damage, so that a negative shift of the threshold voltage can be suppressed, and a reduction in the off-leakage current is achieved. In addition, variations in TFT characteristics can be suppressed, and the reliability can be enhanced.

Figure 8:
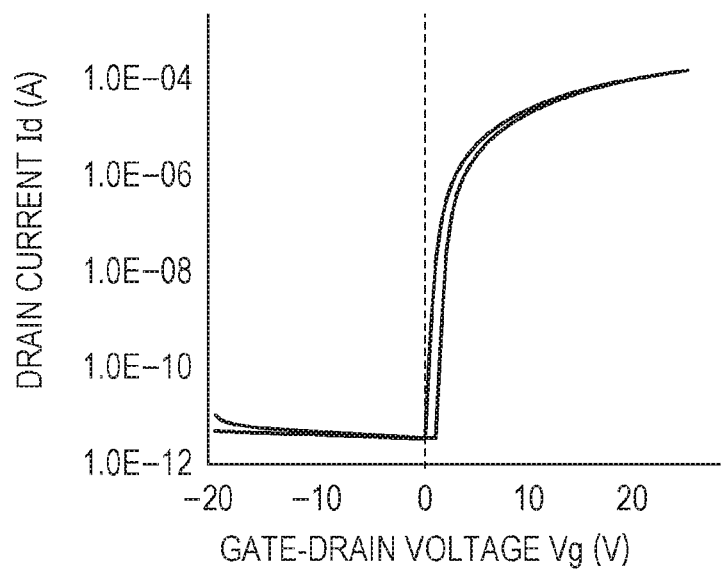
FIG. 8 is a graph of measurement results of the I-V characteristic of an Example TFT.

The I-V characteristic of the Example TFT was measured and the results are illustrated in FIG. 8. FIG. 8 illustrates a result obtained during a negative-to-positive transition of a gate voltage Vg, and a result obtained during a positive-to-negative transition of the gate voltage Vg. FIG. 8 demonstrates that, in the Example TFT, a negative shift of the threshold voltage is suppressed, and a reduction in the off-leakage current is achieved.

Structure of Active Matrix Substrate

This embodiment is applicable to, for example, the active matrix substrate of a display device. When this embodiment is applied to the active matrix substrate, at least one of a plurality of TFTs disposed on the active matrix substrate is an oxide semiconductor TFT having an active layer having a multilayer structure (hereafter, referred to as a "multilayer channel structure") as illustrated in FIGS. 1A and 1B and FIG. 4A to FIG. 6. For example, pixel TFTs disposed for pixels and/or TFTs (circuit TFTs) constituting monolithic drivers may be oxide semiconductor TFTs having a multilayer channel structure.

The active matrix substrate includes a display region (active region) contributing to displaying, and a peripheral region (frame region) positioned outside the display region. The display region has a plurality of gate bus lines GLs and a plurality of source bus lines SLs, and regions surrounded by such lines are "pixels". Such plurality of pixels are arranged in a matrix pattern.

Figure 9:
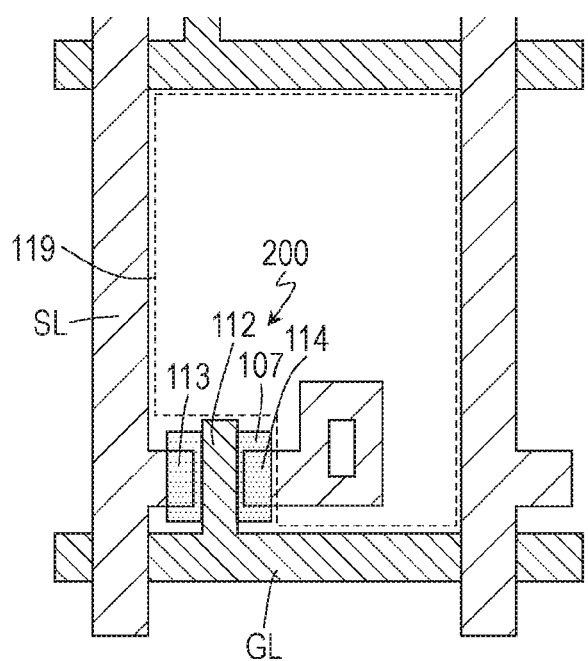
FIG. 9 is a schematic plan view illustrating an example of a semiconductor device (active matrix substrate) according to the first embodiment.

FIG. 9 is a plan view illustrating an example of an active matrix substrate 100 according to this embodiment. FIG. 9 illustrates only one pixel. In this example, as a pixel TFT, an oxide semiconductor TFT 200 having a multilayer channel structure is used. The oxide semiconductor TFT 200 may be any one of the above-described oxide semiconductor TFTs 201 to 203.

As illustrated in FIG. 9, each pixel has the oxide semiconductor TFT 200 serving as a pixel TFT, and a pixel electrode 119 disposed above the oxide semiconductor TFT 200 with an upper interlayer insulating layer (not shown) therebetween. Such pixel electrodes 119 are divided for individual pixels. In each pixel, the oxide semiconductor TFT 200 is formed near the intersection of one of source bus lines SLs and one of gate bus lines GLs. Such a source bus line SL may be formed from, for example, an electroconductive film also used for forming the source electrode 113 of the oxide semiconductor TFT 200, such that the source bus line SL and the source electrode 113 are in one piece. Such a gate bus line GL may be formed from, for example, an electroconductive film also used for forming the lower gate electrode 103 or the upper gate electrode 112 of the oxide semiconductor TFT 200 (in this example, the upper gate electrode 112), such that the gate bus line GL and the lower gate electrode 103 or the upper gate electrode 112 are in one piece. As needed, a connection portion may be disposed so as to electrically connect the upper gate electrode 112 or the lower gate electrode 103 and the gate bus line GL.

The drain electrode 114 of the oxide semiconductor TFT 200 is electrically connected to the corresponding pixel electrode 119. The pixel electrode 119 may be in contact with, within a contact hole formed in the upper interlayer insulating layer, the drain electrode 114.

The active matrix substrate 100 may further include another electrode layer serving as a common electrode on the pixel electrode 119 or between the upper interlayer insulating layer and the pixel electrode 119.

Oxide Semiconductor

Examples of the oxide semiconductor contained in the oxide semiconductor layer 107 include amorphous oxide semiconductors, polycrystalline oxide semiconductors, microcrystalline oxide semiconductors, and crystalline oxide semiconductors whose c axis is oriented substantially perpendicular to the layer surface. The channel oxide semiconductor layer 107A and the protective oxide semiconductor layer 107B may have different crystalline structures. The protective oxide semiconductor layer 107B may have a larger energy gap than the channel oxide semiconductor layer 107A. However, when the energy gap difference between these layers is relatively small, the channel oxide semiconductor layer 107A may have a larger energy gap than the protective oxide semiconductor layer 107B.

The channel oxide semiconductor layer 107A, the protective oxide semiconductor layer 107B, and the intermediate oxide semiconductor layer 107$i$ may contain, for example, at least one metal element selected from In, Ga, and Zn. In this embodiment, the channel oxide semiconductor layer 107A, the protective oxide semiconductor layer 107B, and the intermediate oxide semiconductor layer 107$i$ contain, for example, an In—Ga—Zn—O-based semiconductor (such as indium gallium zinc oxide). The In—Ga—Zn—O-based semiconductor is a ternary oxide of In (indium), Ga (gallium), and Zn (zinc), and the proportions of In, Ga, and Zn (composition ratio) is not particularly limited: for example, In:Ga:Zn=2:2:1, In:Ga:Zn=1:1:1, or In:Ga:Zn=1:1:2. The channel oxide semiconductor layer 107A, the protective oxide semiconductor layer 107B, and the intermediate oxide semiconductor layer 107$i$ can be formed from oxide semiconductor films containing an In—Ga—Zn—O-based semiconductor.

The crystalline structure of a crystalline In—Ga—Zn—O-based semiconductor is disclosed in, for example, Japanese Unexamined Patent Application Publication Nos. 2014-

007399, 2012-134475, and 2014-209727. For reference, the entire contents of Japanese Unexamined Patent Application Publication Nos. 2012-134475 and 2014-209727 are hereby incorporated by reference. A TFT having an In—Ga—Zn-O-based semiconductor layer has a high mobility (20 or more times higher than a-Si TFT) and a low leakage current (less than $\frac{1}{100}$ of that of a-Si TFT), and hence is suitably usable as a driving TFT (for example, a TFT included in a driving circuit that is disposed around a display region including a plurality of pixels and that is disposed on the same substrate having the display region), and is suitably usable as a pixel TFT (TFT disposed for a pixel).

The channel oxide semiconductor layer 107A, the protective oxide semiconductor layer 107B, and the intermediate oxide semiconductor layer 107i may contain, instead of the In—Ga—Zn—O-based semiconductor, another oxide semiconductor, for example, an In—Sn—Zn—O-based semiconductor (such as $In_2O_3$—$SnO_2$—ZnO; InSnZnO). The In—Sn—Zn—O-based semiconductor is a ternary oxide of In (indium), Sn (tin), and Zn (zinc). Alternatively, the channel oxide semiconductor layer 107A and the protective oxide semiconductor layer 107B may contain, for example, an In—Al—Zn—O-based semiconductor, an In—Al—Sn—Zn—O-based semiconductor, an In—Zn—O-based semiconductor, a Zr—In—Zn—O-based semiconductor, or a Hf—In—Zn—O-based semiconductor. On the other hand, the intermediate oxide semiconductor layer 107i may contain, for example, an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, or an In—Ga—Zn—Sn—O-based semiconductor.

Semiconductor devices according to embodiments of the present disclosure are suitably applicable to active matrix substrates and various display devices including liquid crystal displays.

The present disclosure contains subject matter related to that disclosed in Japanese Priority Patent Application JP 2017-219300 filed in the Japan Patent Office on Nov. 14, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A semiconductor device comprising:
   a substrate; and
   an oxide semiconductor thin-film transistor (TFT) supported by the substrate,
   the oxide semiconductor TFT including:
       an oxide semiconductor layer supported by the substrate and having a multilayer structure including a channel oxide semiconductor layer and a protective oxide semiconductor layer, the channel oxide semiconductor layer being disposed closer to the substrate than the protective oxide semiconductor layer,
       an upper insulating layer disposed on the oxide semiconductor layer,
       an upper gate electrode disposed on the upper insulating layer so as to partially overlap the oxide semiconductor layer,
       an interlayer insulating layer covering the oxide semiconductor layer and the upper gate electrode, and
       a first electrode and a second electrode electrically connected to the oxide semiconductor layer, wherein
   a first opening extends through at least the interlayer insulating layer and the protective oxide semiconductor layer, and exposes a portion of the channel oxide semiconductor layer,
   the first electrode is disposed on the interlayer insulating layer and within the first opening, and is in direct contact with, within the first opening, the portion of the channel oxide semiconductor layer,
   the first opening extends through the channel oxide semiconductor layer, and
   the first electrode is, in a portion of a side wall of the first opening, in direct contact with a side surface of the channel oxide semiconductor layer.

2. The semiconductor device according to claim 1, wherein the channel oxide semiconductor layer has higher mobility than the protective oxide semiconductor layer.

3. The semiconductor device according to claim 1, wherein
   a second opening extends through at least the interlayer insulating layer and the protective oxide semiconductor layer, and exposes another portion of the channel oxide semiconductor layer, and
   the second electrode is disposed on the interlayer insulating layer and within the second opening, and is in direct contact with, within the second opening, the other portion of the channel oxide semiconductor layer.

4. The semiconductor device according to claim 1, wherein
   the channel oxide semiconductor layer contains In and Zn, and has a ratio of a number of In atoms higher than a ratio of a number of Zn atoms relative to all metal elements in the channel oxide semiconductor layer, and
   the protective oxide semiconductor layer contains In and Zn, and has a ratio of a number of Zn atoms higher than a ratio of a number of In atoms relative to all metal elements in the protective oxide semiconductor layer.

5. The semiconductor device according to claim 4, wherein the multilayer structure further includes an intermediate oxide semiconductor layer containing In and Zn, disposed between the channel oxide semiconductor layer and the protective oxide semiconductor layer, and having a ratio of a number of Zn atoms and a ratio of a number of In atoms, the ratios being substantially equal to each other relative to all metal elements in the intermediate oxide semiconductor layer.

6. The semiconductor device according to claim 5, wherein the intermediate oxide semiconductor layer contains In, Ga, and Zn.

7. The semiconductor device according to claim 1, wherein the channel oxide semiconductor layer and the protective oxide semiconductor layer are In—Ga—Zn—O-based semiconductor layers, and a ratio of a number of In atoms relative to all metal elements in the channel oxide semiconductor layer is higher than a ratio of a number of In atoms relative to all metal elements in the protective oxide semiconductor layer.

8. The semiconductor device according to claim 1, wherein the multilayer structure further includes an intermediate oxide semiconductor layer between the channel oxide semiconductor layer and the protective oxide semiconductor layer, the channel oxide semiconductor layer and the protective oxide semiconductor layer are crystalline oxide semiconductor layers, and the intermediate oxide semiconductor layer is an amorphous oxide semiconductor layer.

9. The semiconductor device according to claim 1, wherein the channel oxide semiconductor layer and the protective oxide semiconductor layer contain In, Ga, and Zn.

10. The semiconductor device according to claim 1, wherein the channel oxide semiconductor layer has a larger thickness than the protective oxide semiconductor layer.

11. A semiconductor device comprising:
a substrate; and
an oxide semiconductor thin-film transistor (TFT) supported by the substrate,
the oxide semiconductor TFT including:
an oxide semiconductor layer supported by the substrate and having a multilayer structure including a channel oxide semiconductor layer and a protective oxide semiconductor layer, the channel oxide semiconductor layer being disposed closer to the substrate than the protective oxide semiconductor layer,
an upper insulating layer disposed on the oxide semiconductor layer,
an upper gate electrode disposed on the upper insulating layer so as to partially overlap the oxide semiconductor layer,
an interlayer insulating layer covering the oxide semiconductor layer and the upper gate electrode, and
a first electrode and a second electrode electrically connected to the oxide semiconductor layer,
a lower electrode disposed between the oxide semiconductor layer and the substrate, and
a lower insulating layer disposed between the lower electrode and the oxide semiconductor layer, wherein,
a first opening extends through at least the interlayer insulating layer and the protective oxide semiconductor layer, and exposes a portion of the channel oxide semiconductor layer,
the first electrode is disposed on the interlayer insulating layer and within the first opening, and is in direct contact with, within the first opening, the portion of the channel oxide semiconductor layer,
a second opening extends through at least the interlayer insulating layer and the protective oxide semiconductor layer, and exposes another portion of the channel oxide semiconductor layer,
the second electrode is disposed on the interlayer insulating layer and within the second opening, and is in direct contact with, within the second opening, the other portion of the channel oxide semiconductor layer,
when viewed from a direction of a line normal to the substrate, the lower electrode overlaps the first opening, but does not overlap the second opening,
the first opening extends through at least the interlayer insulating layer, the oxide semiconductor layer, and the lower insulating layer, and exposes a portion of the lower electrode,
the first electrode is, in a bottom surface of the first opening, in direct contact with the lower electrode, and is, in a portion of a side wall of the first opening, in direct contact with a side surface of the channel oxide semiconductor layer,
the second opening extends through at least the interlayer insulating layer, the oxide semiconductor layer, and the lower insulating layer, and the second electrode is, in a portion of a side wall of the second opening, in direct contact with another side surface of the channel oxide semiconductor layer, but is not in contact with the lower electrode.

12. The semiconductor device according to claim 11, wherein
the channel oxide semiconductor layer contains In and Zn, and has a ratio of a number of In atoms higher than a ratio of a number of Zn atoms relative to all metal elements in the channel oxide semiconductor layer, and
the protective oxide semiconductor layer contains In and Zn, and has a ratio of a number of Zn atoms higher than a ratio of a number of In atoms relative to all metal elements in the protective oxide semiconductor layer.

13. The semiconductor device according to claim 11, wherein the channel oxide semiconductor layer and the protective oxide semiconductor layer are In—Ga—Zn—O-based semiconductor layers, and a ratio of a number of In atoms relative to all metal elements in the channel oxide semiconductor layer is higher than a ratio of a number of In atoms relative to all metal elements in the protective oxide semiconductor layer.

14. The semiconductor device according to claim 11, wherein the channel oxide semiconductor layer has a larger thickness than the protective oxide semiconductor layer.

15. The semiconductor device according to claim 11, wherein the channel oxide semiconductor layer and the protective oxide semiconductor layer contain In, Ga, and Zn.

16. A semiconductor device comprising:
a substrate; and
an oxide semiconductor thin-film transistor (TFT) supported by the substrate,
the oxide semiconductor TFT including:
an oxide semiconductor layer supported by the substrate and having a multilayer structure including a channel oxide semiconductor layer and a protective oxide semiconductor layer, the channel oxide semiconductor layer being disposed closer to the substrate than the protective oxide semiconductor layer,
an upper insulating layer disposed on the oxide semiconductor layer,
an upper gate electrode disposed on the upper insulating layer so as to partially overlap the oxide semiconductor layer,
an interlayer insulating layer covering the oxide semiconductor layer and the upper gate electrode, and
a first electrode and a second electrode electrically connected to the oxide semiconductor layer, wherein
a first opening extends through at least the interlayer insulating layer and the protective oxide semiconductor layer, and exposes a portion of the channel oxide semiconductor layer,
the first electrode is disposed on the interlayer insulating layer and within the first opening, and is in direct contact with, within the first opening, the portion of the channel oxide semiconductor layer, and
the channel oxide semiconductor layer has a larger thickness than the protective oxide semiconductor layer.

17. The semiconductor device according to claim 16, wherein
a second opening extends through at least the interlayer insulating layer and the protective oxide semiconductor layer, and exposes another portion of the channel oxide semiconductor layer, and
the second electrode is disposed on the interlayer insulating layer and within the second opening, and is in direct contact with, within the second opening, the other portion of the channel oxide semiconductor layer.

18. The semiconductor device according to claim 16, wherein
the channel oxide semiconductor layer contains In and Zn, and has a ratio of a number of In atoms higher than a ratio of a number of Zn atoms relative to all metal elements in the channel oxide semiconductor layer, and
the protective oxide semiconductor layer contains In and Zn, and has a ratio of a number of Zn atoms higher than a ratio of a number of In atoms relative to all metal elements in the protective oxide semiconductor layer.

19. The semiconductor device according to claim 16, wherein the channel oxide semiconductor layer and the protective oxide semiconductor layer are In—Ga—Zn—O-based semiconductor layers, and a ratio of a number of In atoms relative to all metal elements in the channel oxide semiconductor layer is higher than a ratio of a number of In atoms relative to all metal elements in the protective oxide semiconductor layer.

20. The semiconductor device according to claim 16, wherein the channel oxide semiconductor layer and the protective oxide semiconductor layer contain In, Ga, and Zn.

* * * * *